(12) United States Patent
Kouno et al.

(10) Patent No.: US 9,658,285 B2
(45) Date of Patent: May 23, 2017

(54) PROBE APPARATUS

(75) Inventors: Isao Kouno, Yamanashi (JP); Ken Taoka, Yamanashi (JP); Eiichi Shinohara, Yamanashi (JP); Ikuo Ogasawara, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1289 days.

(21) Appl. No.: 13/634,409

(22) PCT Filed: Mar. 11, 2011

(86) PCT No.: PCT/JP2011/055819
§ 371 (c)(1),
(2), (4) Date: Nov. 23, 2012

(87) PCT Pub. No.: WO2011/111834
PCT Pub. Date: Sep. 15, 2011

(65) Prior Publication Data
US 2013/0063171 A1   Mar. 14, 2013

(30) Foreign Application Priority Data

Mar. 12, 2010 (JP) ................................. 2010-055768
Aug. 11, 2010 (JP) ................................. 2010-180348

(51) Int. Cl.
  *G01R 31/28* (2006.01)
  *G01R 1/04* (2006.01)
  *G01R 31/26* (2014.01)

(52) U.S. Cl.
  CPC ....... *G01R 31/2886* (2013.01); *G01R 1/0466* (2013.01); *G01R 31/2608* (2013.01)

(58) Field of Classification Search
  CPC .. G01R 1/0408; G01R 1/0416; G01R 1/0466; G01R 1/0491; G01R 31/26;
  (Continued)

(56) References Cited

U.S. PATENT DOCUMENTS 5,550,482 A * 8/1996 Sano .................. G01R 31/2887
                                                              324/750.19
5,828,225 A   10/1998 Obikane et al.
(Continued)

FOREIGN PATENT DOCUMENTS

JP    62 291937      12/1987
JP    2000 206146    7/2000
(Continued)

OTHER PUBLICATIONS

International Search Report Issued Apr. 12, 2011 in PCT/JP11/55819 Filed Mar. 11, 2011.
(Continued)

*Primary Examiner* — Son Le
*Assistant Examiner* — Dustin Dickinson
(74) *Attorney, Agent, or Firm* — Oblon, McClelland, Maier & Neustadt, L.L.P.

(57) ABSTRACT

A probe apparatus includes a movable mounting table for holding a test object provided with a plurality of power devices including diodes; a probe card arranged above the mounting table with probes; a measuring unit for measuring electrical characteristics of the power devices by bringing the probes into electrical contact with the test object in a state that a conductive film electrode formed on at least a mounting surface of the mounting table is electrically connected to a conductive layer formed on a rear surface of the test object; and a conduction member for electrically interconnecting the conductive film electrode and the measuring unit when measuring the electrical characteristics. The conduction member is interposed between an outer peripheral portion of the probe card and an outer peripheral portion of the mounting table.

3 Claims, 12 Drawing Sheets

(58) Field of Classification Search
CPC ............ G01R 31/2608; G01R 31/2632; G01R 31/2633; G01R 31/2806; G01R 31/2808; G01R 31/2884; G01R 31/2886; G01R 31/2887; G01R 31/2889; G01R 31/2891
See application file for complete search history.

(56) References Cited

U.S. PATENT DOCUMENTS

| | | | | |
|---|---|---|---|---|
| 5,830,565 A * | 11/1998 | Budnaitis | ............... | H01L 23/13 257/E23.004 |
| 6,033,235 A * | 3/2000 | Ikeya | ................... | G01R 1/0483 439/331 |
| 6,100,815 A * | 8/2000 | Pailthorp | ............ | H01C 17/242 324/754.07 |
| 6,166,553 A * | 12/2000 | Sinsheimer | ........ | G01R 31/2886 324/756.05 |
| 2002/0025698 A1 * | 2/2002 | Kamo | ................. | G01R 1/0466 439/70 |
| 2002/0113609 A1 | 8/2002 | Noda | | |
| 2005/0099192 A1 * | 5/2005 | Dunklee | ............ | G01R 31/2851 324/754.03 |
| 2005/0287685 A1 * | 12/2005 | McFadden | ......... | G01R 31/2874 438/17 |
| 2006/0145716 A1 | 7/2006 | Komatsu et al. | | |
| 2007/0063725 A1 | 3/2007 | Komatsu et al. | | |
| 2008/0174325 A1 | 7/2008 | Komatsu et al. | | |
| 2008/0284456 A1 * | 11/2008 | Pang | .................... | G01R 1/0466 324/762.01 |
| 2010/0033199 A1 | 2/2010 | Komatsu et al. | | |

FOREIGN PATENT DOCUMENTS

| | | |
|---|---|---|
| JP | 2002-176142 A | 6/2002 |
| JP | 2003-66109 A | 3/2003 |
| JP | 2006 344662 | 12/2006 |
| JP | 2007 5348 | 1/2007 |
| JP | 2007-40926 A | 2/2007 |
| JP | 2007-123430 A | 5/2007 |
| JP | 2010-98056 A | 4/2010 |

OTHER PUBLICATIONS

Office Action issued Oct. 21, 2014 in the corresponding Taiwanese Application No. 100108202.

* cited by examiner

[ μ MICROSECONDS]

[ μ MICROSECONDS]

PROBE APPARATUS

FIELD OF THE INVENTION

The present invention relates to a probe apparatus for testing the electrical characteristics of a power device. More particularly, the present invention pertains to a probe apparatus capable of measuring the electrical characteristics of a power device at a wafer level, the power device represented by, e.g., an insulated gate bipolar transistor (IGBT) and a diode.

BACKGROUND OF THE INVENTION

Power devices are extensively used as switching elements for different kinds of power sources and for electric devices of motor vehicles or as switching elements for electric devices of industrial machines. As compared with a typical semiconductor device, the power devices are configured to enjoy a high voltage resistance, a high current, a high speed and a high frequency. As the power devices, there are available an IGBT, a diode, a power transistor, a power MOS-FET and a thyristor. These power devices are subjected to electric characteristic test regarding the static characteristics and the dynamic characteristics (switching characteristics) thereof and are then mounted as electronic parts depending on the applications thereof.

A diode is parallel-connected to, e.g., a power MOS-FET, and is used as a switching element of a motor and so forth. The diode has a depletion layer existing in the juncture between an anode and a cathode. It is sometimes the case that the switching function inherent in the diode is impaired by the depletion layer. In particular, if a reverse voltage is applied to the diode while a current $I_F$ flows, the current is sharply decreased to zero as indicated by, e.g., a solid line (an ideal value) in FIG. 13. In reality, however, a small amount of carriers remain in the depletion layer. Therefore, if a voltage is applied in this state, a large countercurrent $I_R$ flows as indicated by a solid line in FIG. 13. The countercurrent reaches the maximum countercurrent value $I_{rp}$ and then comes back to zero. The time required for the countercurrent to be recovered from the maximum countercurrent value $I_{rp}$ to a current value equal to one tenth of the maximum countercurrent value $I_{rp}$ is defined as a reverse recovery time $t_{rr}$. From the viewpoint of the switching characteristics of the diode, it is desirable that the reverse recovery time be short. If the reverse recovery time is long, the diode is sometimes destroyed depending in the use conditions. As the current change (di/dt) of the countercurrent becomes steep, the current grows larger and the diode tends to be destroyed with ease. This destruction is called di/dt destruction. For that reason, the current change (di/dt) in the diode generated when switching the current is measured by mounting the diode to a dedicated measuring instrument, thereby evaluating the reliability of the diode as a switching element.

The present applicants have conducted a variety of studies on a method in which the current change (di/dt) in a diode included in individual power devices of a semiconductor wafer is measured under a wafer state through the use of, e.g., a probe apparatus shown in FIG. 14. The probe apparatus 110 shown in FIG. 14 includes a loader chamber (not shown) within which the semiconductor wafer is transferred and a prober chamber 111 within which the electrical characteristics of the semiconductor wafer transferred from the loader chamber are tested. The probe apparatus 110 is configured to test the electrical characteristics of a power device under a wafer state.

As shown in FIG. 14, a movable mounting table 112 for holding a semiconductor wafer W and a probe card 113 arranged above the mounting table 112 are provided in the prober chamber 111. A conductive film electrode made of an electrically conductive material such as gold or the like is formed on the surface of the mounting table 112. The conductive film electrode is electrically connected to a tester 115 via a cable 114. The probe card 113 includes a plurality of probe pairs 113A Kelvin-connected to individual electrode pads of the semiconductor wafer W. The probe pairs 113A are electrically connected to the tester 115 via force lines 116F and sense lines 116S. The Kelvin-connection of the probe pairs 113A makes it possible to eliminate measurement errors which may be caused by the contact resistance between the probe pairs 113A and the electrode pads and the internal resistance of the respective lines 116F and 116S.

As set forth above, a plurality of power devices are formed in the semiconductor wafer W. Each of the power devices includes, e.g., a MOS-FET (or an IGBT) and a diode, both of which are parallel-connected to each other. The power devices are used as switching elements. A gate electrode and a source electrode of the MOS-FET are formed on the upper surface of the semiconductor wafer W. A drain electrode is formed on the lower surface of the semiconductor wafer W. The conductive film electrode of the mounting table 112 making contact with the drain electrode serves as a drain electrode. The cable 114 connected to the drain electrode includes a force line 114F and a sense line 114S. The cable 114 is Kelvin-connected to the conductive film electrode of the mounting table 112, in which state the cable 114 is connected to the tester 115. In case of the IGBT, the respective electrodes thereof include a gate electrode, a collector electrode and an emitter electrode.

When the switching characteristics of the power devices are measured under a wafer state through the use of the probe apparatus 110, the mounting table 112 holding the semiconductor wafer W is moved to bring the semiconductor wafer W on the mounting table 112 into electrical contact with the probe pairs 113A. If the power devices are turned on by the probe pairs 113A existing at the side of a gate G, a current corresponding to the voltage applied to the gate electrodes of the power devices flows from the cable 114 of the drain electrode (the collector electrode) to the source electrode (the emitter electrode).

If the cable 114 interconnecting the drain electrode (the collector electrode) of the mounting table 112 and the tester 115 become long, the inductance of the cable 114 grows larger and shows an increase of, e.g., 100 nH per 10 cm of the cable. For that reason, if the current change (di/dt) is measured on a microsecond unit through the use of the probe apparatus 110, the current change is small and is deviated from the ideal value as indicated by a broken line (an actual value) in FIG. 13. In the conventional probe apparatus 110, it is therefore difficult to accurately measure the current change (di/dt) inherent in the diode. In some cases, the diode is damaged. When turning off the power devices, an abnormal surge voltage is applied between the drain electrode (the collector electrode) and the source electrode (the emitter electrode). This may sometimes lead to damage of the power devices.

SUMMARY OF THE INVENTION

In view of the aforementioned problems, it is an object of the present invention to provide a probe apparatus capable of reliably measuring the static characteristics and the dynamic characteristics (the switching characteristics) of a power device at a wafer level.

In accordance with one aspect of the present invention, there is provided a probe apparatus, including: a movable mounting table for holding a test object provided with a plurality of power devices including diodes; a probe card arranged above the mounting table and provided with a plurality of probes; a measuring unit for measuring electrical characteristics of the power devices by bringing the probes into electrical contact with the test object in a state that a conductive film electrode formed on at least a mounting surface of the mounting table is electrically connected to a conductive layer formed on a rear surface of the test object placed on the mounting table; and a conduction member for electrically interconnecting the conductive film electrode of the mounting table and the measuring unit when measuring the electrical characteristics of the power devices, the conduction member being interposed between an outer peripheral portion of the probe card and an outer peripheral portion of the mounting table.

Preferably, the conduction member may be provided in the probe card to make electrical contact with the conductive film electrode of the mounting table.

Preferably, the conduction member may have elasticity.

Preferably, the probes and the conduction member may be Kelvin-connected to the measuring unit.

Preferably, the conductive film electrode of the mounting table may be made up of a measuring electrode.

Preferably, the mounting table may include a temperature controlling mechanism.

In accordance with another aspect of the present invention, there is provided a probe apparatus, including: a movable mounting table for holding a test object provided with a plurality of power devices including diodes; a probe card arranged above the mounting table and provided with a plurality of probes; a measuring unit for measuring electrical characteristics of the power devices by bringing the probes into electrical contact with the test object in a state that a conductive film electrode formed on a mounting surface and a circumferential surface of the mounting table is electrically connected to a conductive layer formed on a rear surface of the test object placed on the mounting table; and a conduction mechanism for electrically interconnecting the conductive film electrode formed on the circumferential surface of the mounting table and the measuring unit when measuring the electrical characteristics of the power devices.

Preferably, the conduction mechanism may include a lead conductor having a base end portion connected to the conductive film electrode formed on the circumferential surface of the mounting table, a connecting terminal formed in a tip end portion of the lead conductor in a conductible manner, a conductor interposed between the probe card and the mounting table, and an actuator for electrically connecting and disconnecting the connecting terminal to and from the conductor.

Preferably, the conduction mechanism may include a plurality of lead conductors provided along the circumferential surface of the mounting table, each of the lead conductors having a base end portion connected to the conductive film electrode formed on the circumferential surface of the mounting table, a plurality of connecting terminals formed in tip end portions of the lead conductors in a conductible manner, a ring-shaped conductor interposed between the probe card and the mounting table, and a plurality of actuators for electrically connecting and disconnecting the connecting terminals to and from the ring-shaped conductor.

Preferably, the actuator may be made up of a swing mechanism for swinging the connecting terminal.

Preferably, the actuator may be made up of an elevator mechanism for moving the connecting terminal up and down.

Preferably, the conduction mechanism may include a circular conductor for moving up and down while making electrical contact with the conductive film electrode formed on the circumferential surface of the mounting table, a plurality of connecting terminals provided at a specified interval along a circumferential direction of the circular conductor, a ring-shaped conductor interposed between the circular conductor and the probe card, and an actuator for moving the circular conductor up and down with respect to the ring-shaped conductor to thereby electrically connect and disconnect the connecting terminals to and from the ring-shaped conductor.

Preferably, the conduction mechanism may include a pair of contactors electrically connected to the conductive film electrode formed on the circumferential surface of the mounting table and provided in a mutually 180° spaced-apart relationship along a circumferential direction of the mounting table, and a pair of split conductors interposed between the mounting table and the probe card such that the contactors make electrical contact with the split conductors.

Preferably, the contactors may be adjustable depending on a voltage applied.

With the present invention, it is possible to provide a probe apparatus capable of reliably measuring the static characteristics and the dynamic characteristics (the switching characteristics) of a power device at a wafer level.

BRIEF DESCRIPTION OF THE DRAWINGS

FIG. 4A is a side view showing a state before test and FIG. 4B is a side view showing a state during test.

FIG. 7A is a side view showing a state before test and FIG. 7B is a side view showing a state during test.

FIG. 8A is a side view showing a state before test and FIG. 8B is a side view showing a state during test.

FIG. 12A represents the measured values which are measured by the probe apparatus shown in FIGS. 9A and 9B. FIG. 12B represents the calculated values which are calculated by the probe apparatus shown in FIG. 14.

DETAILED DESCRIPTION OF THE EMBODIMENTS

The present invention will now be described on the basis of embodiments shown in FIGS. 1 through 12B. The probe apparatus of the present invention is provided with a conduction member or a conduction mechanism instead of a cable interconnecting a mounting table and a tester and is configured to measure the dynamic characteristics, one of the electrical characteristics of power devices formed in a semiconductor wafer, under a wafer state.

First Embodiment

Figure 1:
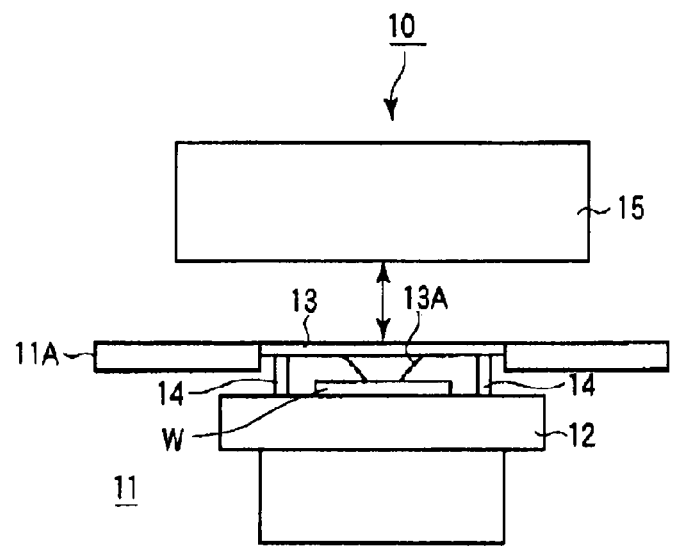
FIG. 1 is a conceptual view showing a probe apparatus according to one embodiment of the present invention.

As shown in FIG. 1, the probe apparatus 10 of the present embodiment is configured to receive, in a prober chamber 11, a semiconductor wafer W transferred from a loader chamber (not shown) for transferring the semiconductor wafer W. Within the prober chamber 11, the probe apparatus 10 measures the current change in a diode included in each of power devices (e.g., IGBTs) formed in the semiconductor wafer W.

As shown in FIG. 1, a mounting table 12 for holding the semiconductor wafer W is provided in the prober chamber 11 in such a manner as to move in an X-direction, a Y-direction, a Z-direction, and a O-direction. On at least the upper surface of the mounting table 12, a conductive film electrode (not shown) made of electrically conductive metal such as gold or the like is formed as a collector electrode. A vacuum suction means is formed in the mounting table 12 to vacuum-suck the semiconductor wafer W toward the mounting surface of the mounting table 12. A temperature controlling mechanism is arranged within the mounting table 12 to heat or cool the semiconductor wafer W to a specified temperature, and the current change (di/dt) in the diode included in each of the power devices is measured.

At the upper side of the mounting table 12, a probe card 13 having a plurality of probes 13A is fixed through a card holder to a head plate 11A forming the upper surface of the prober chamber 11. The probes 13A are brought into electrical contact with electrode pads of the power devices to measure the current change (di/dt) in the diode included in each of the power devices. Terminal electrodes corresponding to the probes 13A are formed on the upper surface of the probe card 13 in a specified pattern. The probes 13A are electrically connected to a below-mentioned tester through the respective terminal electrodes.

A plurality of conductive pins 14 is provided in the outer peripheral edge portion of the probe card 13 at a specified interval along the circumferential direction. As the mounting table 12 moves up and down, the conductive pins come into electrical contact and out of electrical contact with the conductive film electrode (the collector electrode) formed on the upper surface of the mounting table 12. The conductive pins 14 have electricity and make elastic contact with the conductive film electrode. Preferably, the conductive pins 14 are configured to make electrical contact with the conductive film electrode (the collector electrode) in a reliable manner. While it is preferred that the conductive pins 14 are provided at plural points in the outer peripheral edge portion of the probe card 13 at a specified interval, one conductive pin may be provided in only one point.

An alignment mechanism not shown is provided within the prober chamber 11. The gate electrodes and the emitter electrodes of the semiconductor wafer W, i.e., the power devices, are aligned with the probes 13A of the probe card 13 by virtue of the alignment mechanism. After the alignment is performed, the mounting table 12 is moved to just below the first power device to be tested. In that position, the mounting table 12 moves upward. Thus the specified electrode pads of the semiconductor wafer W and the probes 13A make electrical contact with each other. The conductive pins 14 and the conductive film electrode of the mounting table 12 make contact with each other. The conductive pins 14 are arranged such that, regardless of the position of the mounting table 12 during measurement of the electrical characteristics of the power device, at least one of the conductive pins 14 makes electric contact with the conductive film electrode (the collector electrode) of the mounting table 12.

Figure 2:
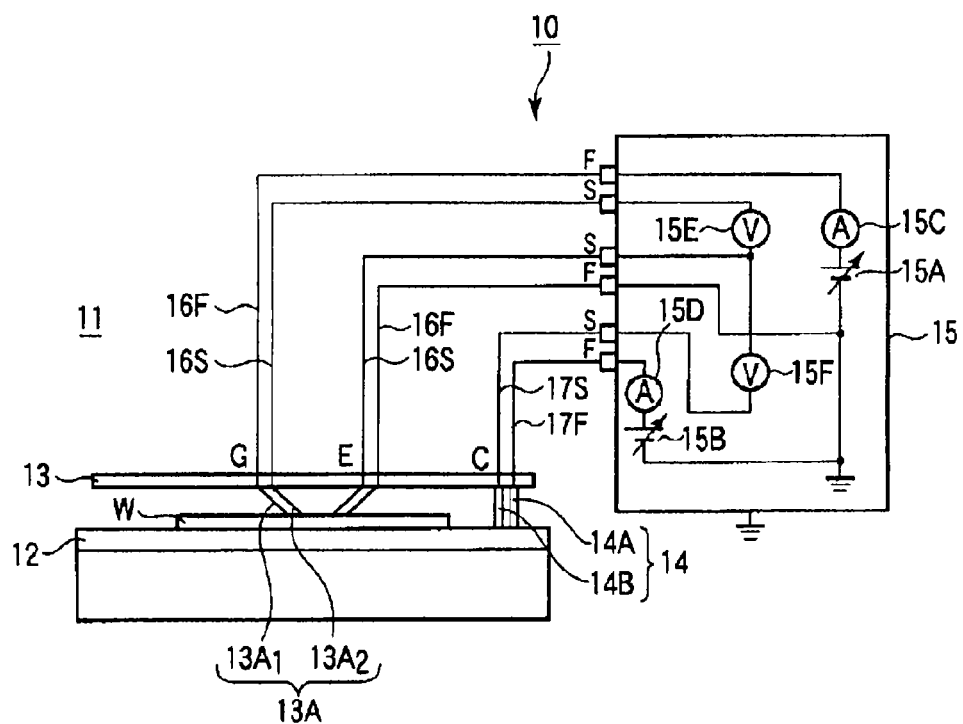
FIG. 2 is a configuration diagram of the probe apparatus shown in FIG. 1.

As a consequence, the lines for connecting the probes 13A and the conductive pins 14 to a tester 15 are Kelvin-connected as shown in FIG. 2.

As shown in FIG. 2, each of the probes 13A is made up of a pair of first and second probes $13A_1$ and $13A_2$. In the following description, each of the probes 13A will be referred to as probe pair 13A. The probe pair 13A is formed such that the first and second probes $13A_1$ and $13A_2$ are Kelvin-connected to the electrode pads of the semiconductor wafer W. The first probe $13A_1$ is connected to the tester 15 via a force line 16F. The second probe $13A_2$ is connected to the tester 15 via a sense line 16S. The Kelvin-connection of the probe pairs 13A makes it possible to eliminate measurement errors which are caused by the contact resistance between the first and second probes $13A_1$ and $13A_2$ and the electrode pads of the semiconductor wafer W and by the internal resistance of the force line 16F and the sense line 16S interconnecting the first and second probes $13A_1$ and $13A_2$ and the tester 15.

Referring to FIG. 2, the left and right probe pairs 13A and 13A are configured such that one (left) probe pair 13A makes contact with the gate electrode of an IGBT while the other (right) probe pair 13A makes contact with the emitter electrode of the IGBT making up the power device.

Just like the probe pair 13A, each of the conductive pins 14 is made up of a conductive pin pair 14 including a first conductive pin 14A and a second conductive pin 14B. The conductive pin pair 14 is Kelvin-connected via the terminal electrodes on the rear surface of the outer peripheral portion of the probe card 13 to which the first and second conductive pins 14A and 14B are connected. The first and second conductive pins 14A and 14B are connected to the tester 15 via a force line 17F and a sense line 17S. The conductive pin pair 14 serve as collector pins making electrical contact with the conductive film electrodes (the collector electrode) of the mounting table 12. In this manner, just like the probe pair 13A, the conductive pin pair 14 is electrically connected to tester 15 via the probe card 13. Therefore, just like the probe card 13, the electric circuit length from the collector electrode of the mounting table 12 to the tester 15 is very short. For that reason, as compared with the cable 114 employed in the probe apparatus 110 shown in FIG. 10, it is possible to significantly reduce the inductance. Accordingly, the probe apparatus 10 of the present embodiment can reliably measure the current change (di/dt) in the diode included in the power device on a microsecond scale.

As stated above, the probe pair 13A and the conductive pin pair 14 are connected to the tester 15. The tester 15 is detachably attached to the upper surface of the head plate 11A. The tester 15 makes electrical contact with the terminal electrode for the probe pair 13A and the terminal electrode for the conductive pin pair 14 formed on the upper surface of the probe card 13, through a conduction means, e.g., a pogo pin. The tester 15 is electrically connected to a plurality of probe pairs 13A and a plurality of conductive pin pairs 14.

As shown in FIG. 2, the tester 15 includes first and second power sources 15A and 15B, first and second ammeters 15C and 15D and first and second voltmeters 15E and 15F. The tester 15 is configured to measure the current change (di/dt) in the diode through the IGBT. The first power source 15A and the first ammeter 15C are connected to the first probe 13A$_1$ via the force line 16F. The second power source 15B and the second ammeter 15D are connected to the first conductive pin 14A via the force line 17F. The first voltmeter 15E is connected to the second probe 13A$_2$ via the sense line 16S. The second voltmeter 15F is connected to the second conductive pin 14B via the sense line 17S.

Next, description will be made on the measurement of the current change (di/dt). First, the semiconductor wafer W is transferred from the loader chamber onto the mounting table 12 and is suction-fixed to the mounting surface of the mounting table 12. Then, the mounting table 12 is moved to align the electrode pads of the semiconductor wafer W with the probe pairs 13A in cooperation with the alignment mechanism. Thereafter, the mounting table 12 is moved such that the power device to be first tested is positioned just below the probe pairs 13A. In that position, the mounting table 12 is moved upward so that the electrode pads of the power device can make electrical contact with the probe pairs 13A.

At this time, the conductive pin pair 14 protruding from the lower surface of the probe card 13 makes elastic contact with the conductive film electrode (the collector electrode) of the mounting table 12. As a consequence, the gate electrode and the emitter electrode of the IGBT of the power device are electrically connected to the tester 15 via the corresponding probe pairs 13A. The collector electrode of the IGBT of the power device is electrically connected to the tester 15 via the collector electrode of the mounting table 12 and the conductive pin pairs 14.

Thereafter, if the voltage of the first power source 15A of the tester 15 is applied to a driver (not shown) to thereby transmit an on-signal to the probe pair 13A existing at the side of the gate G, the gate electrode of the IGBT of the power device is switched on. Pursuant to the voltage applied by the second power source 15B, a current flows from the collector electrode to the emitter electrode via the conductive pin pair 14 existing at the side of the collector C. Subsequently, if an off-signal is transmitted to the probe pair 13A existing at the side of the gate G, the IGBT is switched off and the current is stopped to flow from the collector electrode to the emitter electrode.

Figure 13:
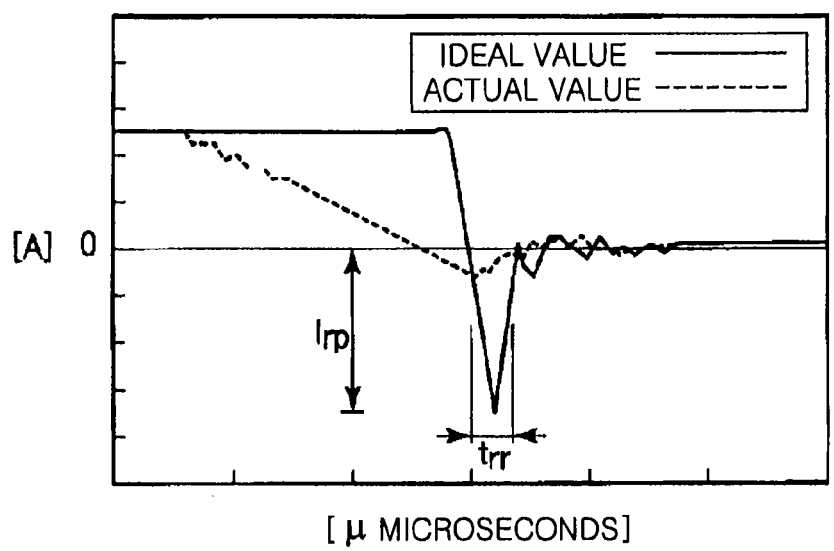
FIG. 13 is a current waveform diagram showing the current change generated during the current switching operation of a diode. The solid line indicates the ideal value of the current change. The broken line indicates the actual value measured by the probe apparatus shown in FIG. 14.
Figure 14:
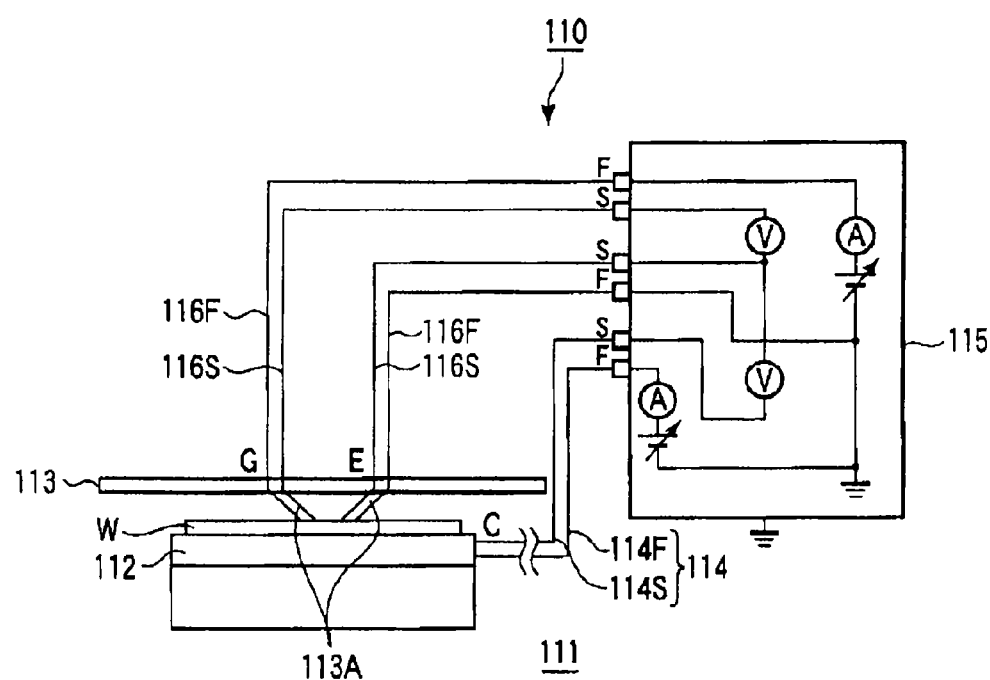
FIG. 14 is a configuration diagram showing one example of the conventional probe apparatus used in measuring the current change in a diode.

At this time, a regenerative current is generated by the coils existing within the tester 15, whereby a reverse current flows through the diode. In this state, if the IGBT is switched on through the probe pair 13A existing at the side of the gate G, the diode is kept in a conductive state for the reverse recovery time close to the ideal value indicated by a solid line in FIG. 13. The current change (di/dt) during this time period is measured and the result of measurement is displayed as a current waveform on an oscilloscope (not shown). The di/dt resistance of the diode can be evaluated on the basis of the current change (di/dt) obtained at this time.

The di/dt destruction of the diode tends to occur at a temperature of 80° C. or more. Therefore, the relationship between the di/dt resistance of the diode and the temperature can be evaluated by heating the mounting table 12 to a high temperature of 80° C. or more and measuring the current change (di/dt) of the diode at the high temperature.

With the present embodiment described above, the current change (di/dt) generated during the current switching operation of the diode included in the power device can be measured through the use of the probe apparatus 10 while the semiconductor wafer W having the power devices are kept in a wafer state. It is therefore possible to evaluate the di/dt destruction of the diode as the power device and the switching characteristics of the IGBT making up the power device. It is also possible to evaluate the resistance against the di/dt destruction of the diode at a high temperature of 80° C. or more.

Second Embodiment

The probe apparatus of the present embodiment has the same configuration as the configuration of the first embodiment except that a conduction mechanism is provided in place of the conductive pins 14 employed in the first embodiment. The following description will be centered on the features of the probe apparatus of the present embodiment, with the components identical with or similar to those of the probe apparatus 10 of the first embodiment designated by like reference symbols.

Figure 3:
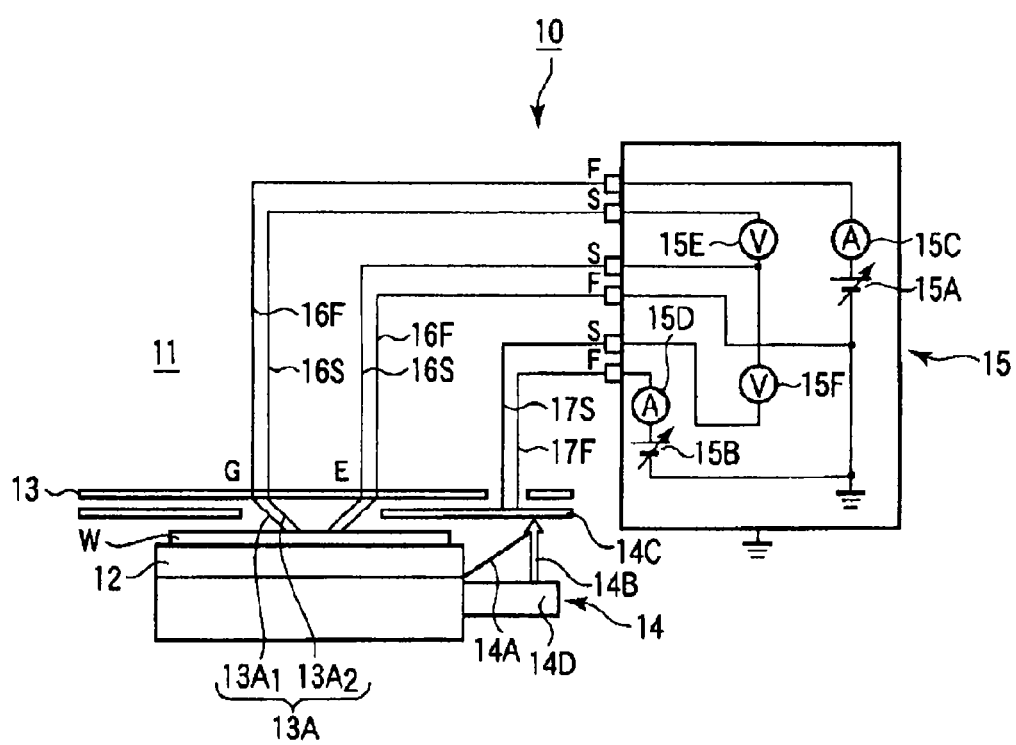
FIG. 3 is a conceptual view showing a probe apparatus according to another embodiment of the present invention, which view corresponds to FIG. 1.

As shown in FIG. 3, the probe apparatus 10 of the present embodiment is configured to receive a semiconductor wafer W provided with a plurality of power devices including diodes in a prober chamber 11 adjacent to a loader chamber (not shown) for transferring the swivel mechanism 12 and to measure the current change of the diode included in each of the power devices under a wafer state. Except the conduction mechanism 14, the probe apparatus 10 of the present embodiment has the same configuration as the configuration of the first embodiment.

As shown in FIG. 3, the conduction mechanism 14 employed in the present embodiment includes a lead conductor 14A having a base end portion connected to a conductive film electrode formed on the circumferential surface of the mounting table 12, a connecting terminal 14B (indicated by a white arrow in FIG. 3) formed in the tip end portion of the lead conductor 14A in a conductible manner, a ring-shaped conductor (hereinafter called a "ring conductor") 14C arranged between the probe card 13 and the mounting table 12, and an actuator 14D for bringing the connecting terminal 14B into contact or out of contact with the ring conductor 14C. The conduction mechanism 14 is configured to electrically connect the conductive film electrode formed on the upper surface and the circumferential surface of the mounting table 12 to the tester 15. As shown in FIG. 3, the upper surface of the ring conductor 14C is Kelvin-connected to the tester 15 via a force line 17F and a sense line 17S. In the present embodiment, the ring conductor 14C is independently provided and is interposed between the mounting table 12 and the probe card 13. Alternatively, a card holder (not shown) for holding the probe card or a head plate to which the probe card is fixed may be used as the ring conductor 14C. In the present embodiment, the ring conductor 14C is described by way of example. However, the conductor with which the connecting terminal 14B comes into electrical contact and out of electrical contact is not limited to the ring shape. As will be described later, two split conductors may be used as the conductor with which the connecting terminal 14B comes into electrical contact and out of electrical contact.

Figure 4A:
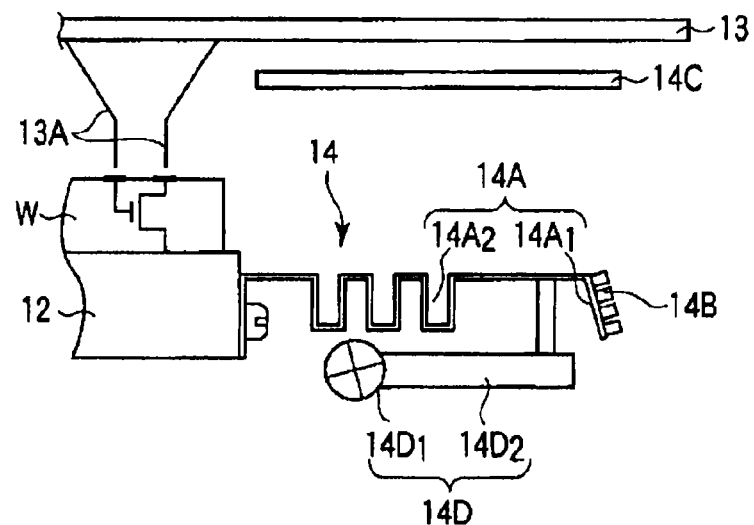
FIGS. 4A and 4B are views specifically showing a conduction mechanism, one major part of the probe apparatus shown in FIG. 3.
Figure 4B:
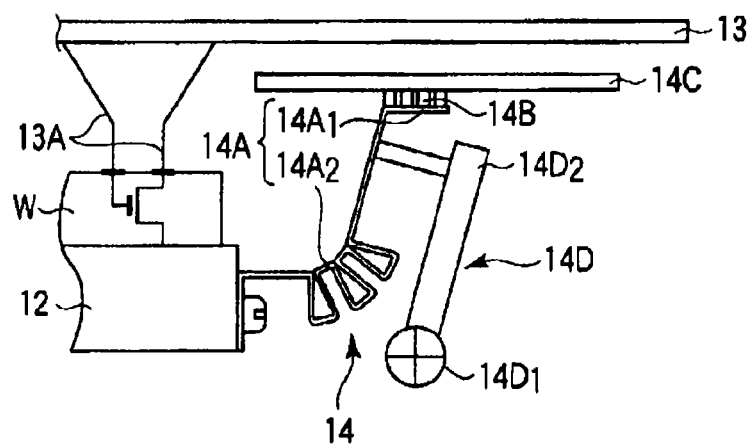

FIGS. 4A and 4B are views specifically showing the conduction mechanism 14 shown in FIG. 3. As shown in FIG. 4A, the lead conductor 14A making up the conduction mechanism 14 is formed into, e.g., a band-like shape. One end portion of the lead conductor 14A is screw-fixed to the conductive film electrode formed on the circumferential surface of the mounting table 12. A plurality of connecting terminals 14B is fixed to the tip end portion of the lead conductor 14A. The fixing portion $14A_1$ of the connecting terminals 14B is formed into a bent shape. A meandering portion $14A_2$ bent into a meandering shape when seen in a side view is formed between the portion of the lead conductor 14A connected to the mounting table 12 and the fixing portion $14A_1$. Thus the lead conductor 14A is easily bent and stretched in the meandering portion $14A_2$. The actuator 14D includes a rotary drive portion $14D_1$ and a swing body $14D_2$ extending from the rotary drive portion $14D_1$. The swing body $14D_2$ is connected to the lead conductor 14A in the vicinity of the fixing portion $14A_1$. Accordingly, the connecting terminals 14B can be electrically connected to or disconnected from the lower surface of the ring conductor 14C by driving the actuator 14D and swinging the fixing portion $14A_1$ of the lead conductor 14A through the rotary drive portion $14D_1$ and the swing body $14D_2$.

Next, the operation of the probe apparatus 10 according to the present embodiment will be described with reference to FIGS. 3 and 4. Except the conduction mechanism 14, the present embodiment has the same configuration as the contact device of the first embodiment. Since the components of the present embodiment other than the conduction mechanism 14 remain the same as those of the first embodiment, description will be focused on operation of the conduction mechanism 14.

After the semiconductor wafer W and the probe card 13 are aligned with each other as in the first embodiment, the mounting table 12 existing just below the first power device is moved upward from the position shown in FIG. 4A. The electrode pads of the power device and the probes 13A of the probe card 13 come into electrical contact with each other as shown in FIG. 4B. At this time, the actuator 14D of the conduction mechanism 14 is driven and the connecting terminals 14B are swung counterclockwise about the meandering portion $14A_2$ of the lead conductor 14A through the rotary drive portion $14D_1$ and the swing body $14D_2$. Thus the connecting terminals 14B make electrical contact with the lower surface of the ring conductor 14C as shown in FIG. 4B. As a consequence, the gate electrode and the emitter electrode of the IGBT of the power device are electrically connected to the tester 15 via the corresponding probe pairs 13A. The collector electrode existing on the lower surface of the IGBT is electrically connected to the tester 15 via the conductive film electrode (the collector electrode) of the mounting table 12 and the conduction mechanism pairs 14.

Thereafter, if the voltage of the first power source 15A of the tester 15 is applied to a driver (not shown) as shown in FIG. 3 to thereby transmit an on-signal to the probe pair 13A existing at the side of the gate G, the gate electrode of the IGBT of the power device is switched on. Pursuant to the voltage applied by the second power source 15B, a current flows from the collector electrode to the emitter electrode via the ring conductor 14C, the connecting terminals 14B and the meandering portion 14A of conduction mechanism 14. Subsequently, if an off-signal is transmitted to the probe pair 13A existing at the side of the gate G, the IGBT is switched off and the current is stopped to flow from the collector electrode to the emitter electrode.

At this time, a regenerative current is generated by the coils existing within the tester 15, whereby a reverse current flows through the diode. In this state, if the IGBT is switched on through the probe pair 13A existing at the side of the gate G, the diode is kept in a conductive state for the reverse recovery time. The voltage during this time period is detected by the second voltmeter 15F and the current change (di/dt) is measured on the basis of the voltage thus detected. The di/dt resistance of the diode can be evaluated on the basis of the current change (di/dt) obtained at this time. When the di/dt destruction of the diode is measured at a high temperature of 80° C. or more, it is possible to measure the current change (di/dt) of the diode at a high temperature by heating the mounting table 12 to a high temperature of 80° C. or more.

With the present embodiment described above, the collector electrode of the mounting table 12 can be connected to the tester 15 through the conduction mechanism 14. In the same manner as in the first embodiment, it is possible to measure the current change (di/dt) generated during the current switching operation of the diode included in the power device. It is therefore possible to evaluate the di/dt destruction of the diode and the switching characteristics of the IGBT. It is also possible to evaluate the resistance against the di/dt destruction of the diode at a high temperature of 80° C. or more.

Third Embodiment

The conduction mechanism 14 shown in FIG. 4 may be replaced by, e.g., the conduction mechanisms 14 shown in FIGS. 5A through 5D. The conduction mechanisms 14 shown in FIGS. 5A through 5D can promise substantially the same operations and effects as provided by the probe apparatus 10 shown in FIGS. 3 and 4.

Figure 5A:
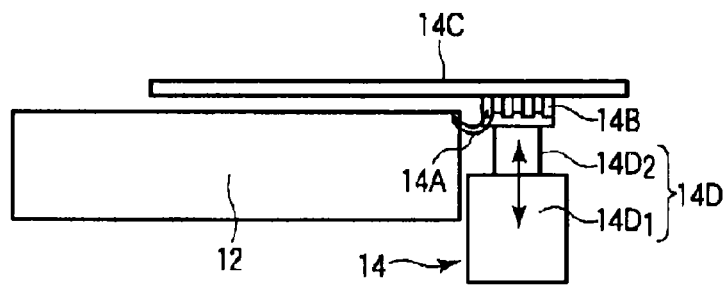
FIGS. 5A through 5D are views showing different modified examples of the conduction mechanism shown in FIGS. 4A and 4B, which views are side views corresponding to FIGS. 4A and 4B.

In the conduction mechanism 14 shown in FIG. 5A, the lead conductor 14A shown in FIGS. 4A and 4B is made up of lead wires 14A and the actuator 14D is made up of a cylinder mechanism such as an air cylinder or the like. The actuator 14D includes a cylinder $14D_1$ using a compressed air as a drive power source and a rod $14D_2$. Connecting terminals 14B are attached to the tip end of the rod $14D_2$. As the rod $14D_2$ is moved up and down, the connecting terminals 14B are electrically connected to or disconnected from a ring conductor 14C. The lead wires 14A are connected to the connecting terminals 14B. The mounting table 12 and the tester 15 are electrically connected to or disconnected from each other through the lead wires 14A and the connecting terminals 14B.

Accordingly, if the actuator 14D of the conduction mechanism 14 is driven during test, the rod $14D_2$ is moved up in the direction indicated by an arrow. The connecting terminals 14B make electrical contact with the lower surface of the ring conductor 14C. As a consequence, the gate electrode and the emitter electrode of the power device are electrically connected to the tester 15 via the corresponding probe pairs 13A. The collector electrode existing on the lower surface of the power device is electrically connected to the tester 15 via the conductive film electrode (the collector electrode) of the mounting table 12 and the conduction mechanism 14. It is therefore possible to test the electrical characteristics of the power device.

Figure 5B:
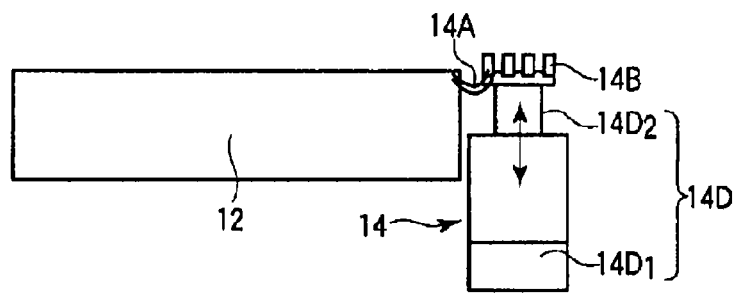

In the conduction mechanism 14 shown in FIG. 5B, an electromagnetic solenoid $14D_1$ is used as the drive power source of the actuator 14D. The electromagnetic solenoid $14D_1$ moves the connecting terminals 14B up and down through the rod $14D_2$ of the cylinder mechanism, whereby the connecting terminals 14B come into electrical contact and out of electrical contact with the ring conductor 14C. While the ring conductor 14C is not shown in FIG. 5B, the remaining components of the conduction mechanism 14 are configured like the conduction mechanism 14 shown in FIG. 5A.

Figure 5C:
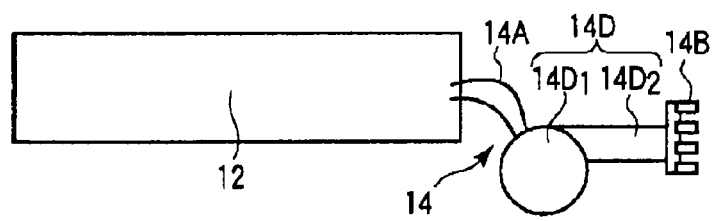
Figure 5D:
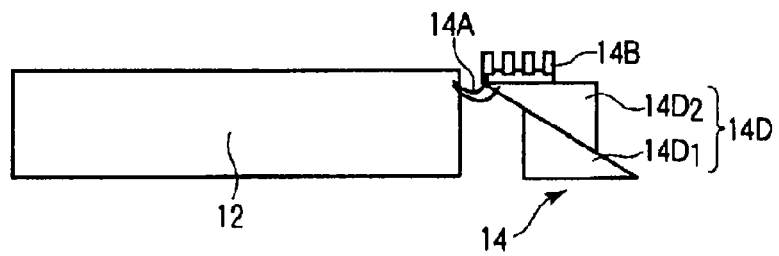

In the conduction mechanism 14 shown in FIG. 5C, just like the conduction mechanism 14 shown in FIG. 4, the actuator 14D includes a rotary drive portion $14D_1$ and a swing body $14D_2$. The connecting terminals 14B are provided at the tip end of the swing body $14D_2$. Lead wires 14A are employed in place of the lead conductor 14A shown in FIG. 4. The conductive film electrode of the mounting table 12 and the swing body $14D_2$ are connected to each other via the lead wires 14A. In this case, if the actuator 14D is driven as in FIG. 4, the connecting terminals 14B are swung by virtue of the swing body $14D_2$ and are electrically connected to or disconnected from the ring conductor 14C. While the ring conductor 14C is not shown in FIG. 5C, the remaining components of the conduction mechanism 14 are configured like the conduction mechanism 14 shown in FIG. 4.

In the conduction mechanism 14 shown in FIG. 50, the actuator 14D is made up of a slide-type motor. The actuator 14D includes a base $14D_1$ having a slant surface and a built-in motor and an elevator body $14D_2$ having a slant surface. The slant surface of the base $14D_1$ and the slant surface of the elevator body $14D_2$ engage with each other. The elevator body $14D_2$ is moved up and down along the slant surface of the base $14D_1$. A linear motion part (not shown) moved back and forth by the motor is arranged on the slant surface of the base $14D_1$. The elevator body $14D_2$ is connected to the linear motion part through a connecting member (not shown). Connecting terminals 14B are provided on the horizontal surface (upper surface) of the elevator body $14D_2$. Therefore, upon operating the actuator 14D, the motor existing within the base $14D_1$ is driven and the elevator body $14D_2$ is moved up and down through the linear motion part. The connecting terminals 14B come into electrical contact and out of electrical contact with the lower surface of the ring conductor (not shown). While the ring conductor is not shown in FIG. 5D, the remaining components of the conduction mechanism 14 are configured like the conduction mechanism 14 shown in FIG. 4.

While the conduction mechanism 14 is arranged at one point in the examples shown in FIGS. 5A through 5D, a plurality of conduction mechanisms 14 may be arranged at a specified interval over the whole circumference of the mounting table 12. A pair of conduction mechanisms 14 may be arranged at a 180° interval along the circumferential direction. In the latter case, the ring conductor 14C may be replaced by split conductors (see, e.g., FIG. 9) with which two conduction mechanisms 14 make electrical contact. The shape of the split conductors is not particularly limited.

Figure 6:
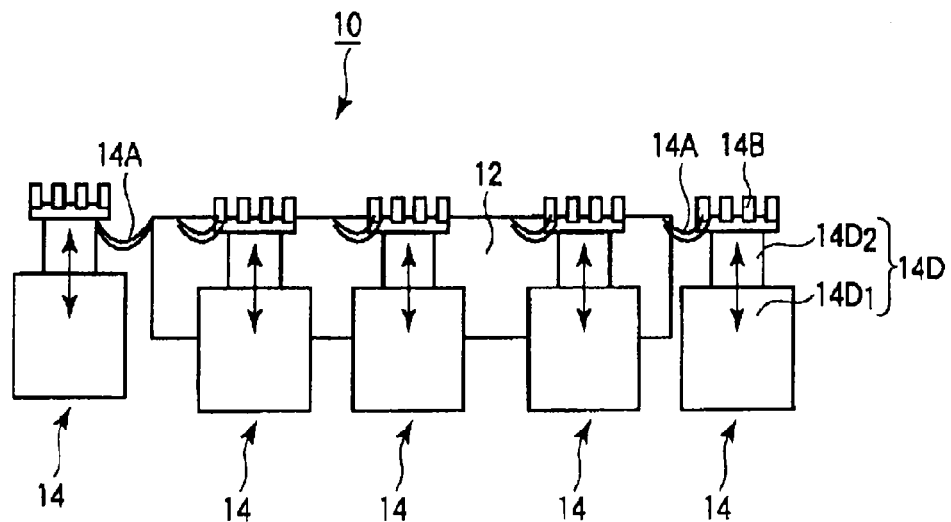
FIG. 6 is a side view showing major parts of a probe apparatus according to a further embodiment of the present invention.

The conduction mechanisms 14 shown in FIGS. 3 through 5 are configured such that the mounting table 12 and the ring conductor 14C are connected to each other at one point. As shown in FIGS. 6 through 8, the conduction mechanisms 14 may be configured such that the mounting table 12 and the ring conductor 14C are electrically connected to each other at plural points along the whole circumference thereof. The conduction mechanisms 14 shown in FIGS. 6 through 8 can promise substantially the same operations and effects as provided by the probe apparatus 10 shown in FIGS. 3 through 5.

The conduction mechanism 14 shown in FIG. 6 includes a plurality of lead wires 14A arranged at a specified interval along the whole circumference of the mounting table 12 and connected at one ends to the conductive film electrode formed on the circumferential surface of the mounting table 12, a plurality of connecting terminals 14B connected to the other ends of the lead wires 14A, a ring conductor (not shown) with which the connecting terminals 14B make contact at a regular interval along the circumferential direction, and a plurality of actuators 14D for moving the connecting terminals 14B up and down. The lead wires 14A, the connecting terminals 14B and the actuators 14D are configured like the conduction mechanism 14 shown in FIG. 5A. The actuators 14D may be driven independently or simultaneously. Since the connecting terminals 14B make electrical contact with the whole circumference of the ring conductor 14C in this manner, it is possible to reliably perform the test of the electrical characteristics of the power device. The remaining components of the conduction mechanism 14 are configured just like those of the probe apparatus 10 shown in FIG. 3.

Figure 7A:
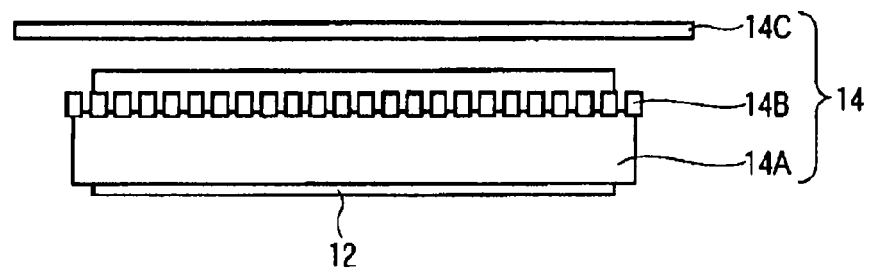
FIGS. 7A and 7B are side views showing major parts of a probe apparatus according to a still further embodiment of the present invention.
Figure 7B:
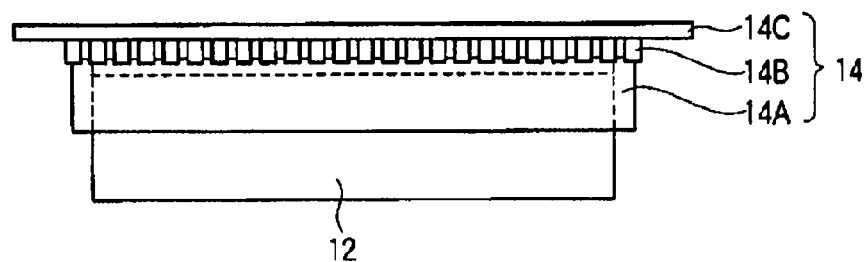

The conduction mechanism 14 shown in FIGS. 7A and 7B includes a cylindrical conductor 14A making sliding contact with the conductive film electrode formed on the circumferential surface of the mounting table 12, a plurality of connecting terminals 14B installed upright at a specified interval along the whole circumference of the upper surface of the cylindrical conductor 14A and connected to the conductive film electrode, a ring conductor 14C with which the connecting terminals 14B make contact at a regular interval along the circumferential direction, and an actuator (not shown) for moving the cylindrical conductor 14A up and down. In this conduction mechanism 14, upon driving the actuator, the cylindrical conductor 14A is moved up and down while making sliding contact with the conductive film electrode of the mounting table 12. The connecting terminals 14B existing on the upper surface of the cylindrical conductor 14A come into electrical contact and out of electrical contact with the lower surface of the ring conductor 14C. During non-test, the cylindrical conductor 14A waits below the mounting surface of the mounting table as shown in FIG. 7A. During test, the cylindrical conductor 14A is moved up along the outer circumferential surface of the mounting table 12 through the actuator as shown in FIG. 7B. Thus the connecting terminals 14B can come into electrical contact and out of electrical contact with the ring conductor 14C. Since the connecting terminals 14B make electrical contact with the whole circumference of the ring conductor, it is possible to reliably perform the test of the electrical characteristics of the power device.

Figure 8A:
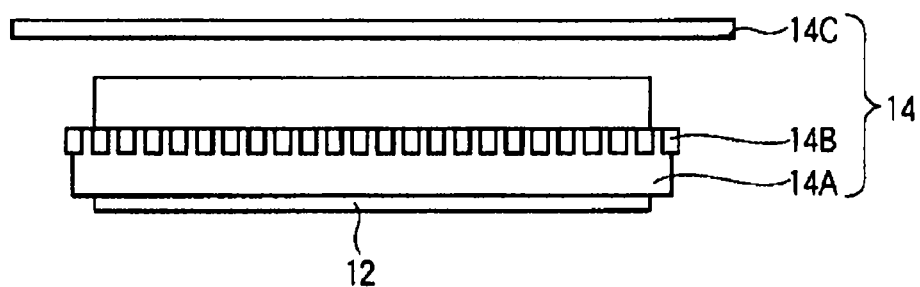
FIGS. 8A and 8B are side views showing major parts of a probe apparatus according to a yet still further embodiment of the present invention.
Figure 8B:
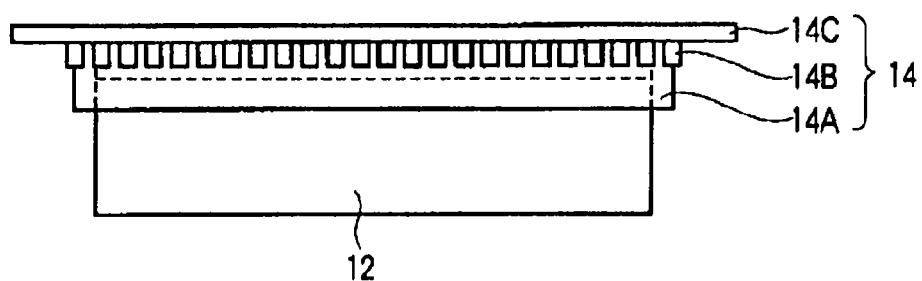

Just like the conduction mechanism 14 shown in FIGS. 7A and 7B, the conduction mechanism 14 shown in FIGS. 8A and 8B includes a cylindrical conductor 14A, a plurality of connecting terminals 14B, a ring conductor 14C and an actuator (not shown). In this conduction mechanism 14, the cylindrical conductor 14A and the connecting terminals 14B differ from those shown in FIGS. 7A and 7B. The connecting terminals 14B shown in FIGS. 8A and 8B are vertically movably attached to the upper end portion of the cylindrical conductor 14A. In the conduction mechanism 14, therefore, the cylindrical conductor 14A is moved up and down with respect to the mounting table 12. The connecting terminals 14B are moved up and down in the upper end portion of the cylindrical conductor 14A. The connecting terminals 14B are moved up and down at two steps so that they can come into electrical contact and out of electrical contact with the lower surface of the ring conductor 14C. During non-test, the cylindrical conductor 14A waits below the mounting surface of the mounting table 12 as shown in FIG. 8A. During test, the cylindrical conductor 14A is moved up along the outer circumferential surface of the mounting table 12 through the actuator as shown in FIG. 8B. Thus the cylindrical conductor 14A comes into electrical contact with the whole circumference of the ring conductor 14C. The connecting terminals 14B are moved up from the cylindrical conductor 14A. In this case, the conduction mechanism 14 can perform a contact operation like the contact operation of the conduction mechanism 14 shown in FIGS. 7A and 7B.

Fourth Embodiment

The probe apparatus of the present embodiment is configured like the probe apparatus 10 shown in FIG. 4 except that connecting terminals and split conductors shown in FIGS. 9 and 10 are employed in place of the conduction mechanism 14 shown in FIG. 4. For that reason, the components identical with or similar to those of the conduction mechanism 14 shown in FIG. 4 will be designated by like reference symbols in describing the conduction mechanism of the present embodiment.

Figure 9A:
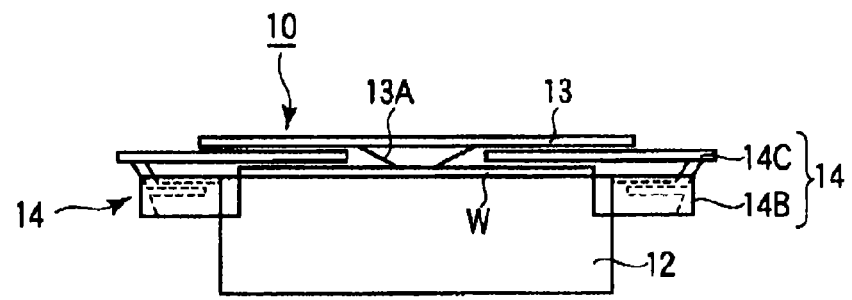
FIGS. 9A and 9B are side and plan views showing major parts of a probe apparatus according to an even yet still further embodiment of the present invention.
Figure 9B:
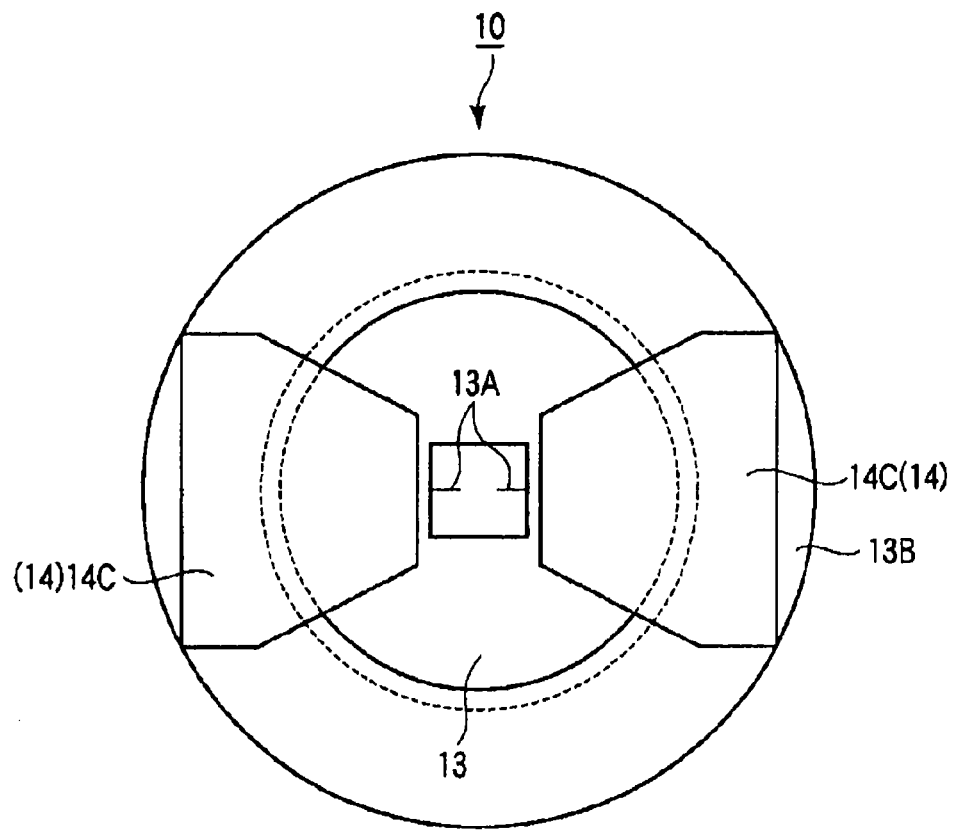

As in the respective embodiments described above, the conduction mechanism 14 of the present embodiment is configured to measure the electrical characteristics of the power devices formed in the semiconductor wafer under a wafer state. In other words, as shown in FIGS. 9A and 9B, the conduction mechanism 14 of the present embodiment includes a pair of connecting terminals 14B provided on the circumferential surface of the mounting table 12 in a mutually opposing relationship and a pair of split conductors 14C provided between the mounting table 12 and the probe card 13 in a corresponding relationship with the connecting terminals 14B. No matter where the mounting table 12 may move to measure the electrical characteristics of each of the power devices, the connecting terminals 14B make elastic contact with either split conductors 14C corresponding thereto, thereby electrically interconnecting the conductive film electrode (the collector electrode) and the tester (not shown).

Figure 10A:
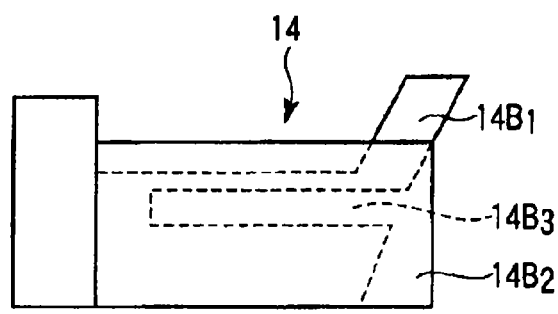
FIGS. 10A and 10B are side and front views showing a connecting terminal of the probe apparatus shown in FIGS. 9A and 9B.
Figure 10B:
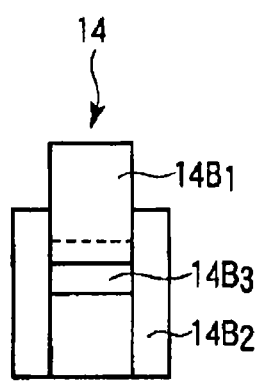

As shown in FIGS. 10A and 10B, each of the connecting terminals 14B includes a contactor 14B$_1$ formed by unifying a plurality of metal plates and a pair of left and right support bodies 14B$_2$ gripping the contactor 14B$_1$. Each of the connecting terminals 14B is fixed to the upper portion of the mounting table 12 through the support bodies 14B$_2$. The contactor 14B$_1$ is electrically connected to the conductive film electrode formed on the circumferential surface of the mounting table 12. A cutout portion 14B$_3$ extending from the protruding end surface of the mounting table 12 toward the mounting table 12 is formed in the contactor 14B$_1$. The contactor 14B$_1$ makes elastic contact with the split conductors 14C by the cutout portion 14B$_3$. The contactor 14B$_1$ is formed so that the number of laminated metal plates can be adjusted depending on the magnitude of a current value measured.

As shown in FIG. 9B, the split conductors 14C are formed in a symmetrical relationship and are connected and fixed to, e.g., a card holder 13B for holding the probe card 13. As shown in FIG. 9B, each of the split conductors 14C has a first side positioned at the side of the probes 13A and formed shorter than a second side opposing the first side. A pair of third sides perpendicular to the second side is formed at the opposite ends of the second side. A pair of fourth sides is formed between the third sides and the first side. The spacing between the fourth sides is gradually decreased toward the first side. That is to say, each of the split conductors 14C is formed into a hexagonal shape. As stated above, the split conductors 14C are formed into such a size that, no matter where the mounting table 12 may move within the prober chamber to measure the electrical characteristics of each of the power devices, the corresponding connecting terminals 14B make contact with the split conductors 14C.

Figure 11A:
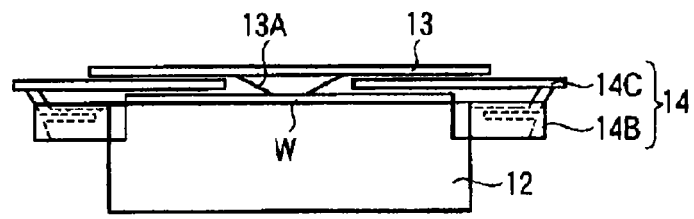
FIGS. 11A through 11C are side views for explaining the electrical characteristic test of a semiconductor wafer performed through the use of the probe apparatus shown in FIGS. 9A and 9B.

In order to measure the electrical characteristics of the power device existing in the central region of the semiconductor wafer W, the mounting table 12 is moved to just below the center of the probe card 13 as shown in FIG. 11A. If the mounting table 12 is moved up from that position, the probes 13A make electrical contact with the gate electrode and the emitter electrode formed in the central IGBT. The contactors 14B$_1$ of the connecting terminals 14B make electrical contact with the left and right split conductors 14C and become the collector electrodes. It is therefore possible to measure the electrical characteristics of the power device.

Figure 11B:
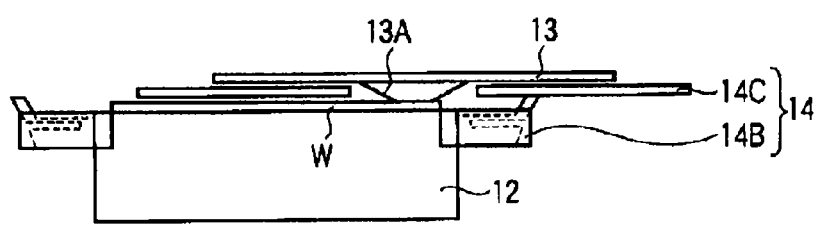

In order to measure the electrical characteristics of the power device existing at the right end of the semiconductor wafer W, the mounting table 12 is moved as shown in FIG. 11B so that the right end power device can reach the position just below the center of the probe card 13. If the mounting table 12 is moved up from that position, the probes 13A make electrical contact with the gate electrode and the emitter electrode formed in the right end IGBT. Only the contactor 14B$_1$ of the right connecting terminal 14B makes electrical contact with the right split conductor 14C and becomes the collector electrode. It is therefore possible to measure the electrical characteristics of the power device. The left connecting terminal 14B is kept out of contact with the left split conductor 14C.

Figure 11C:
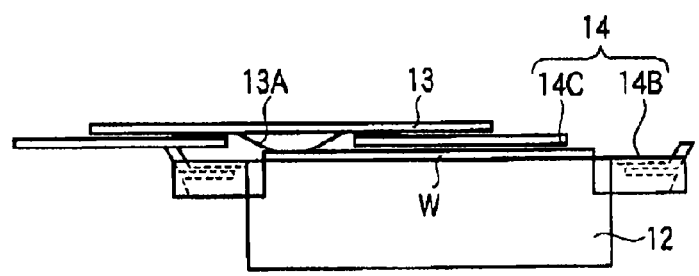

In order to measure the electrical characteristics of the power device existing at the left end of the semiconductor wafer W, the mounting table 12 is moved as shown in FIG. 11C so that the left end power device can reach the position just below the center of the probe card 13. If the mounting table 12 is moved up from that position, the probes 13A make electrical contact with the gate electrode and the emitter electrode formed in the left end IGBT. Only the contactor 14B$_1$ of the left connecting terminal 14B makes electrical contact with the left split conductor 14C and becomes the collector electrode. It is therefore possible to measure the electrical characteristics of the power device. The right connecting terminal 14B is kept out of contact with the right split conductor 14C.

Figure 12A:
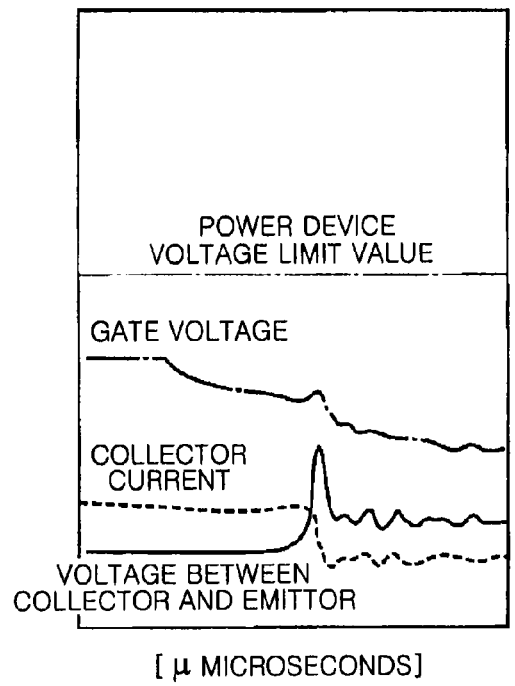
FIGS. 12A and 12B are graphs representing the measured values of a current and a voltage indicating the switching characteristics of a power device, which values are measured by the probe apparatus shown in FIGS. 9A and 9B.

As described above, when measuring the switching characteristics of the IGBT as the electrical characteristics of each of the power devices, the line length between the conductive film electrode (the collector electrode) and the tester is as small as, e.g., about 10 cm, and hence the inductance is small. Thus the switching characteristics become superior and the turn-off time grows short. As shown in FIG. 12A, the surge voltage applied between the collector and the emitter during the turn-off time can be reduced to a voltage value far smaller than the limit voltage of the IGBT (the power device). This makes it possible to accurately measure the dynamic characteristics of the power device. The turn-off time means the time required for a collector current to decrease from 90% to 5%.

Figure 12B:
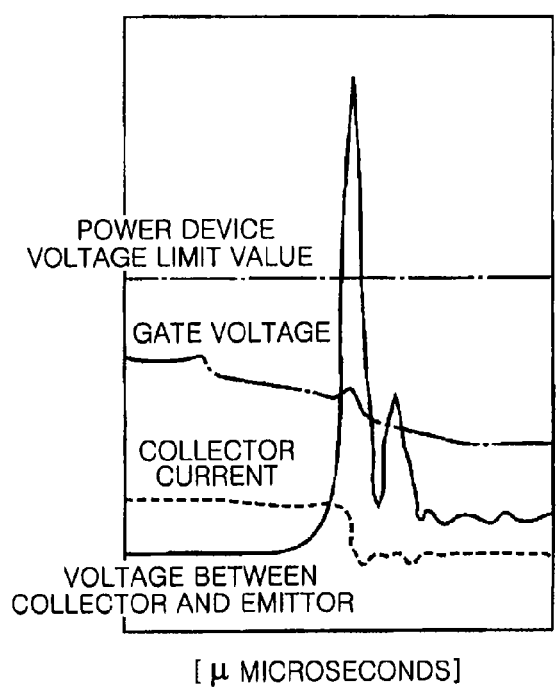

In contrast, if a cable is employed as is the case in the conventional probe apparatus, the inductance in the cable is large. As shown in FIG. 12B, the abnormal surge voltage greater than the limit voltage of the IGBT is applied between the collector and the emitter during the turn-off time of the IGBT, thereby destroying the IGBT. When measuring the electrical characteristics of the power device, it is desirable to apply a voltage and a current larger than the rated voltage and the rated current. In the conventional probe apparatus, however, there is a possibility that the rated voltage may exceed the limit value. This makes it impossible to apply even the rated voltage. It is therefore substantially impossible to measure the dynamic characteristics of the power device. The surge voltage shown in FIG. 12B is not an actually-measured value but a calculated value.

In the present embodiment described above, just like the first and second embodiments, it is possible to reliably and accurately measure the dynamic characteristics of the power device.

The present invention is not limited to the embodiments described above. If necessary, it is possible to change the design of the respective components. In the first embodiment, the conductive pins 14 are attached to the outer peripheral portion of the probe card 13. As an alternative example, the conductive pins 14 may be provided at a specified interval along the whole circumference of the outer peripheral portion of the mounting table 12. The conductive pins 14 are electrically connected to the conductive film electrode (the collector electrode) of the mounting table 12. Although the conductive pins 14 may be installed upright on the upper surface of the mounting table 12, it is desirable that the conductive pins 14 be retractably provided in the mounting table 12. In that case, conductive film electrodes are formed on the inner circumferential surfaces of the holes through which the conductive pins 14 extend and retract. The conductive pins 14 make sliding contact with the conductive film electrodes so that the conductive pins 14 can be kept electrically connected to the conductive film electrodes in the extended position.

What is claimed is:

1. A probe apparatus, comprising:
a movable mounting table for holding a test object provided with a plurality of power devices including diodes;
a probe card arranged above the mounting table and provided with a plurality of probes;
a measuring unit for measuring electrical characteristics of the power devices by bringing the probes into electrical contact with the test object in a state that a conductive film electrode formed on a mounting surface and a circumferential surface of the mounting table is electrically connected to a conductive layer formed on a rear surface of the test object placed on the mounting table; and
a conduction mechanism for electrically interconnecting the conductive film electrode formed on the circumferential surface of the mounting table and the measuring unit when measuring the electrical characteristics of the power devices,
wherein the conduction mechanism includes a circular conductor for moving up and down while making electrical contact with the conductive film electrode formed on the circumferential surface of the mounting table, a plurality of connecting terminals provided at a specified interval along a circumferential direction of the circular conductor, a ring-shaped conductor interposed between the circular conductor and the probe card, and an actuator for moving the circular conductor up and down with respect to the ring-shaped conductor to thereby electrically connect and disconnect the connecting terminals to and from the ring-shaped conductor, and
wherein the circular conductor is disposed to surround the mounting table.

2. A probe apparatus, comprising:
a movable mounting table for holding a test object provided with a plurality of power devices including diodes;
a probe card arranged above the mounting table and provided with a plurality of probes;
a measuring unit for measuring electrical characteristics of the power devices by bringing the probes into electrical contact with the test object in a state that a conductive film electrode formed on a mounting surface and a circumferential surface of the mounting table is electrically connected to a conductive layer formed on a rear surface of the test object placed on the mounting table; and
a conduction mechanism for electrically interconnecting the conductive film electrode formed on the circumferential surface of the mounting table and the measuring unit when measuring the electrical characteristics of the power devices,
wherein the conduction mechanism includes a pair of contactors electrically connected to the conductive film electrode formed on the circumferential surface of the mounting table and provided in a mutually 180° spaced-apart relationship along a circumferential direction of the mounting table, and a pair of split conductors interposed between the mounting table and the probe card such that the contactors make electrical contact with the split conductors.

3. The apparatus of claim 2, wherein the contactors are adjustable depending on a voltage applied.

* * * * *